(12) United States Patent
Kawaguchi

(10) Patent No.: US 7,683,392 B2
(45) Date of Patent: Mar. 23, 2010

(54) SEMICONDUCTOR DEVICE WITH ANISOTROPY-RELAXED QUANTUM DOTS

(75) Inventor: Kenichi Kawaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 11/390,151

(22) Filed: Mar. 28, 2006

(65) Prior Publication Data

US 2007/0145351 A1    Jun. 28, 2007

(30) Foreign Application Priority Data

Dec. 22, 2005  (JP) ............................. 2005-369468
Jan. 16, 2006  (JP) ............................. 2006-007234

(51) Int. Cl.
*H01L 33/00* (2006.01)

(52) U.S. Cl. ............................. 257/97; 257/13; 257/17; 257/103; 257/E33.003; 438/47

(58) Field of Classification Search ................ 257/97
See application file for complete search history.

(56) References Cited

U.S. PATENT DOCUMENTS

2002/0119680 A1*  8/2002  Wang et al. ................. 438/962
2005/0199870 A1*  9/2005  Gray et al. ................... 257/14

FOREIGN PATENT DOCUMENTS

JP          2005-136267          5/2005

OTHER PUBLICATIONS

Qui et al, Applied Physics Letters vol. 84 No. 9, Mar. 1, 2004 "Self-assembled . . . substrates" pp. 1510-1512.*
K. Mukai et al., "1.3-µm CW Lasing of InGaAs-GaAs Quantum Dots at Room Temperature with a Threshold Current of 8 mA," IEEE Photonics Technology Letters, vol. 11, No. 10, Oct. 1999, pp. 1205-1207.
K. Akahane et al., "Fabrication of ultra-high density InAs-stacked quantum dots by strain-controlled growth on InP(311)B substrate," Journal of Crystal Growth 245, 2002, pp. 31.-36.

* cited by examiner

*Primary Examiner*—Jerome Jackson, Jr.
(74) *Attorney, Agent, or Firm*—Kratz, Quintos & Hanson, LLP

(57) ABSTRACT

A semiconductor quantum dot device includes: an inclined InP substrate whose principal surface normal is inclined from a [001] direction to a [1 −10] direction in a (001) plane; and semiconductor quantum dots made of $InAs_{1-x}Sb_x$ (0<x<1) and disposed above the principal surface of the inclined InP substrate. Anisotropy of quantum dots is strong on the (001) plane. Anisotropy can be relaxed by using the inclined (001) substrate.

9 Claims, 7 Drawing Sheets

SEMICONDUCTOR DEVICE WITH ANISOTROPY-RELAXED QUANTUM DOTS

CROSS REFERENCE TO RELATED APPLICATION

This application is based on and claims priority of Japanese Patent Application Nos. 2005-369468 filed on Dec. 22, 2005 and 2006-007234 filed on Jan. 16, 2006, the entire contents of which are incorporated herein by reference.

BACKGROUND OF THE INVENTION

A) Field of the Invention

The present invention relates to a semiconductor device and more particularly to a semiconductor quantum dot device using semiconductor quantum dots.

B) Description of the Related Art

Various semiconductor devices are known which use the quantum effect. High electron mobility transistors (HEMTs) and emission devices using a quantum well (QW) and a multiquantum well (MQW) are well known as semiconductor devices using one-dimensional quantization in a thickness direction.

Known types of quantization other than one-dimension include quantum wires using two-dimensional quantization and quantum dots (or quantum boxes) using three-dimensional quantization. Various emission devices using quantum dots have recently been developed.

Fabrication techniques for self-grown quantum dots using lattice mismatched material in a Stranski-Krastanov growth mode (S-K mode) have been researched diligently starting in the mid-1990s. As material having a large lattice mismatch is grown on a substrate, a wetting-layer is formed initially. As the layer becomes thick, accumulated strains become large so that three-dimensional growth occurs to form islands such as semi-spheres. These islands can be used as quantum dots. There are recent reports on devices such as a semiconductor laser using such self-grown quantum dots. The possibility of quantum dot devices is becoming real.

In fabricating a quantum dot laser for an optical communication light source, it is desired to form quantum dots having an emission wavelength of 1.3 μm (emission energy of 0.95 eV) or an emission wavelength of 1.55 μm (emission energy of 0.8 eV).

For example, there is a report on a semiconductor quantum dot laser which is fabricated by forming InGaAs dots in an active layer on a GaAs substrate and it can demonstrate continuous oscillation in a 1.3 μm band at a room temperature (IEEE PHOTONICS TECHNOLOGY LETTERS, Vol. 11, 1205, 1999).

There is a report on InAs quantum dots in a 1.55 μm band formed on an InGaAlAs spacer layer on an InP (311) B substrate (J. Crystal Growth 245, 31, (2002)). Lattice mismatches of InAs and InGaAlAs with the InP substrate are opposite in polarity and the influences thereof cancel out each other. Emission at a wavelength of 1.58 μm is observed by photoluminescence.

The present inventor and his colleague have proposed the structure that an InGaAsP barrier layer and an InAsSb quantum dot layer are alternately stacked on an InP substrate (JP-A-2005-136267). Mixed crystal InAsSb has large band gap bowing: a band gap of 0.35 eV at an As composition of 1.0 (InAs) and a minimum band gap of 0.1 eV at an As composition of about 0.6, and can change the band gap in a range from 0.1 to 0.35 eV by changing the composition. Since a lattice constant is larger than that of InAs, the size of an InAsSb quantum dot is smaller than an InAs quantum dot. The mixed crystal InAsSb is a material having the possibility of providing quantum dots having a large quantum effect.

SUMMARY OF THE INVENTION

Although there are various reports on the quantum dot laser, fabrication techniques are still not established. It is desired to develop effective quantum dot fabrication techniques.

An object of the present invention is to provide a semiconductor quantum dot device having adequate quantum dots and a method for its fabrication.

Another object of the present invention is to provide a semiconductor quantum dot device having excellent characteristics and its a method for its fabrication.

According to one aspect of the present invention, there is provided a semiconductor quantum dot device comprising:

an inclined InP substrate having a principal surface normal which is inclined from a [001] direction to an in-plane direction in a (001) plane, in a range of [1-10] direction ±45° excluding both end points of the range; and semiconductor quantum dots made of $InAs_{1-x}Sb_x$ ($0<x<1$) and disposed above the principal surface of said inclined InP substrate.

The shape of a quantum dot is adjusted. In-plane anisotropy can be reduced.

DESCRIPTION OF THE PREFERRED EMBODIMENTS

A conventional InP optical communication device is fabricated using a (001) InP substrate. The present inventor and his colleague have proposed the structure that an InGaAsP barrier layer and an InAsSb quantum dot layer are stacked alternately on an InP substrate. A new phenomenon has been found by forming quantum dots on a (001) InP substrate.

Figure 1A:
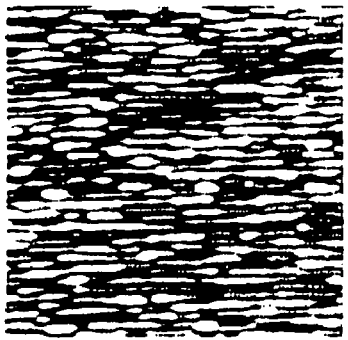
FIGS. 1A to 1E are a cross sectional view and atomic force microscope (AFM) images for explaining the progress of research made by the present inventor.

As shown in FIG. 1A, samples were formed by growing $InAs_{0.88}Sb_{0.12}$ quantum dots on a (001) InP substrate. The fabrication sequence of samples will be described hereinunder. A (001) InP substrate 1 was loaded in a reaction chamber of a metal organic chemical vapor deposition (MOCVD) system, hydrogen was introduced as carrier gas, a pressure in the reaction chamber was set to 50 torr, a phosphine atmosphere was formed by flowing phosphine ($PH_3$), and the substrate was heated to 630° C. After the temperature became stable, trimethylindium (TMIn) was additionally supplied and an InP buffer layer 2 was grown to a thickness of about 100 nm. A supply ratio (V/III ratio) of group V element(s) to group III element(s) was 100 and a growth rate was 1 μm/h.

Thereafter, the temperature was lowered to 480° C. in the $PH_3$ atmosphere. After the temperature became stable, a supply of $PH_3$ was stopped, and trimethylindium (TMIn), arsine ($AsH_3$) and trimethylantimony (TMSb) were supplied corresponding in amount to three molecular layers (MLs) converted to two-dimensional layer thickness to grow $InAs_{0.8}Sb_{0.12}$ quantum dots 3. A V/III ratio was 10, a supply ratio of TMSb to $AsH_3$ was 0.4:0.6 and a growth rate was 0.1 μm/h. After the quantum dots were grown, the temperature was lowered to a room temperature in a hydrogen atmosphere, and samples with grown quantum dots were picked up from the reaction chamber.

Figure 1B:
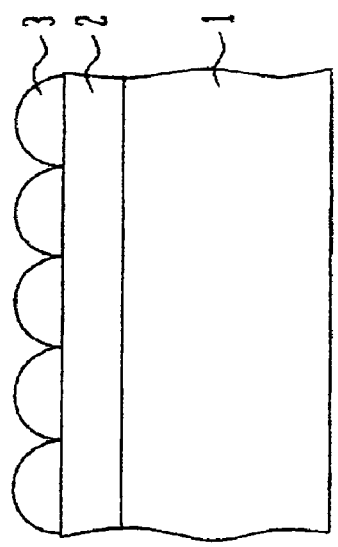

FIG. 1B shows an AFM image of a surface of a sample having grown quantum dots, the AFM image being observed with an atomic force microscope (AFM). Each quantum dot has a size of about 15 nm in [110] direction and about 80 nm in [1-10] direction. The quantum dot has strong in-plane anisotropy at a ratio of about 5 between an in-plane long direction size and an in-plane short direction size. It can be said that this quantum dot is like a quantum wire. Even if a sufficient quantum confinement effect is presented in the [110] direction, there is a large possibility that the quantum confinement effect becomes insufficient in the [1-10] direction. Such anisotropy may cause, for example, polarization dependency.

The present inventor has considered introducing an off-angle to a (001) substrate. Substrates whose plane normal was inclined (slanted or set off) from the [001] direction to the [1-10] direction by 2° and 5° were purchased from a substrate maker. It can be said that these two substrates are a kind of a plane B substrate because the substrate is set off along a B direction, although an inclined angle cannot be defined by the index plane. For the purpose of comparison, a substrate whose plane normal was set off by 5° from the [001] direction to the [110] direction was purchased from a substrate maker. Similarly it can be said that this substrate is a kind of a plane A substrate. Quantum dots were grown on these substrates by the fabrication sequence similar to that described above. First, a description will be made on quantum dots grown on the substrate whose plane normal was set off from the [001] direction to the [1-10] direction.

As shown in FIG. 1B, at the off-angle of 0° the quantum dot has a size of about 15 nm in the [110] direction and a size of about 80 nm in the [1-10] direction, and a ratio of an in-plane long direction size to an in-plane short direction size is about 5.

Figure 1E:
Figure 1D:
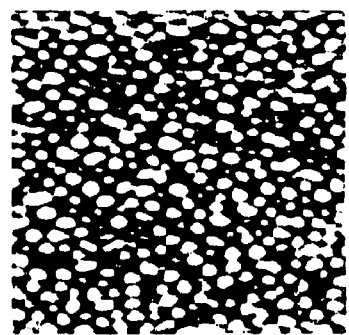
Figure 1C:
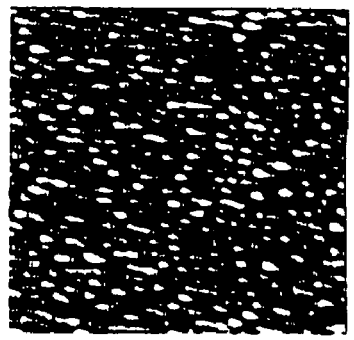

FIG. 1C shows an AFM image of quantum dots grown on the substrate whose plane normal was set off by 2° from the [001] direction to the [1-10] direction. The size of each quantum dot in the in-plane long direction is reduced and the size in the in-plane short direction is increased. A ratio of an in-plane long direction size to an in-plane short direction size was about 2.3.

FIG. 1D shows an AFM image of quantum dots grown on the substrate whose plane normal was set off by 5° from the [001] direction to the [1-10] direction. In-plane anisotropy is reduced to the extent that it can be said to be almost in-plane isotropy. A ratio of an in-plane long direction size to an in-plane short direction size was about 1.2.

Figure 2A:
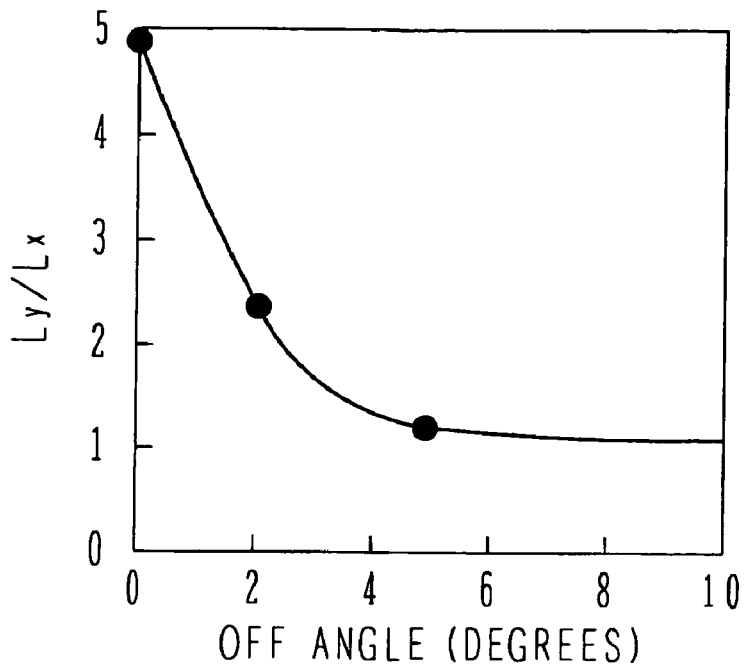
FIGS. 2A and 2B are graphs showing summarized experimental results.

FIG. 2A is a graph showing synthesized experiment results. The abscissa represents an off-angle in the [1-10] direction, and the ordinate represents a ratio Ly/Lx of a dot length Ly along the [1-10] direction (in-plane long direction) to a dot length Lx along the [110] direction (in-plane short direction). The Ly/Lx ratio is about 5 at an off-angle of 0°, reduces to about 2.3 at an off-angle of 2°, and reduces to about 1.2 at an off-angle of 5°. As the off-angle increases, the in-plane anisotropy reduces and there is a tendency of saturation. As the off-angle is made larger than 5°, it is presumed that the Ly/Lx ratio becomes asymptotical to 1.0. However, it is not necessarily found in practice that Ly/Lx=1.0. The specific objects may be achieved by relaxing in-plane anisotropy.

As compared to an off-angle of 0°, the Ly/Lx ratio becomes a half or smaller (2.5 or smaller) at the off-angle of 2°. In-plane anisotropy is relaxed considerably. At the off-angle of 5°, the Ly/Lx ratio becomes about a quarter (1.3 or smaller). A shape near isotropy is realized. This shape is expected to be useful in many applications. It is expected from the plot that the Ly/Lx ratio is about 1.5 or smaller at an off-angle of 4°. This relaxation is expected to be sufficiently useful depending upon an application field. As above, in-plane anisotropy reduces rapidly by incorporating an off-angle in the [1-10] direction.

If the off-angle is set too large, the property of the (001) plane is lost. From the view point of application to devices, the off-angle of the plane normal from the [001] direction to the [1-10] direction is preferably set to 10° or smaller in order not to adversely affect patterning a mesa stripe or the like.

For the comparison, a sample was fabricated having quantum dots grown on a substrate whose plane normal was set off by 50 from the [001] direction to the [110] direction.

FIG. 1E shows an AFM image of quantum dots grown on the substrate whose plane normal was set off by 5° from the [001] direction to the [110] direction. In-plane anisotropy was observed which is substantially equal to that of the quantum dots shown in FIG. 1B. The Ly/Lx ratio of quantum dots is about 5. It can be considered that the off-angle to the [110] direction does not influence in-plane isotropy of quantum dots.

Figure 2B:
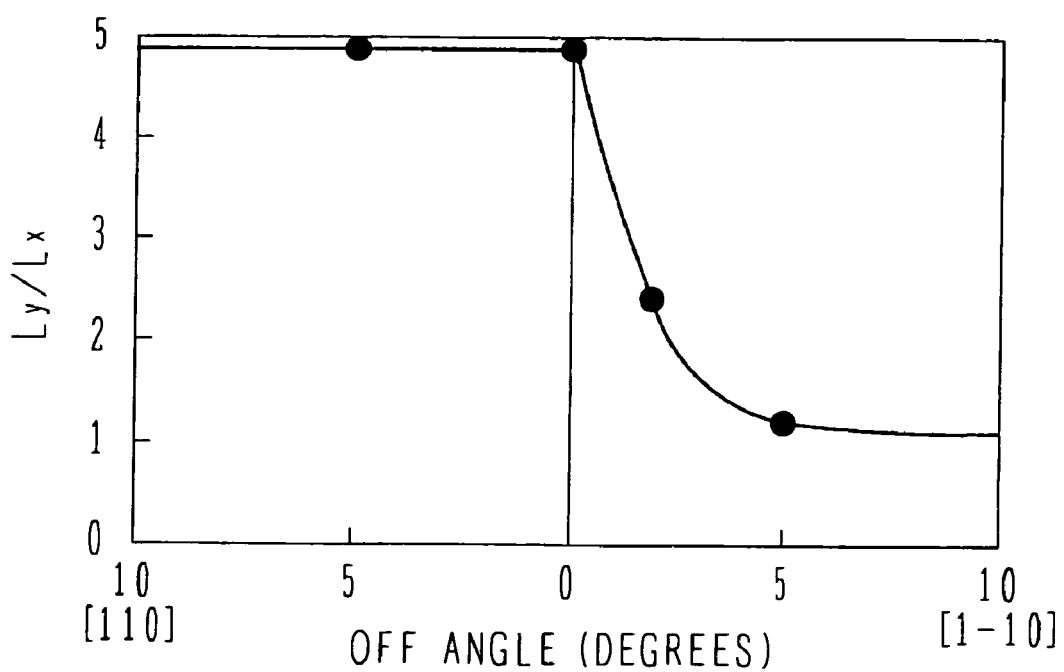

FIG. 2B is a graph showing results of the experiment. As the plane normal is set off from the [001] direction to the [1-10] direction, in-plane anisotropy of quantum dots reduces rapidly as the off-angle is increased. However, even if the plane normal is set off from the [001] direction to the [110] direction, the Ly/Lx ratio of quantum dots grown on the substrate hardly changes and in-plane anisotropy does not change. A working or processing precision of crystal orientation is about ±0.5°. The influence of the off-angle is large even if the off-angle is small. The value of the off-angle is intended to have a difference smaller than ±0.5°. For example, the off-angle of 2° indicates a range of 2°±0.5°. (excluding both ends of the range).

It can be considered that the off-angle in the [1-10] direction has the effect of reducing in-plane anisotropy. The experiment results shown in FIG. 1E may be ascribed to that even if the off-angle is set in the [110] direction, no off-angle is generated in [1-10] direction, which is perpendicular to [110] direction. When an off-angle is set in an in-plane direction other than the [110] direction, a subsidiary off-angle is generated in the [1-10] direction. However, in order for the off-angle to have a larger effect, the in-plane direction of the off-angle is preferably in a range of ±45°. (excluding both ends of the range) from the [1-10] direction, or more preferably in a range of ±5°. (excluding both ends of the range) from the [1-10] direction. It can be considered that the in-plane direction of off-angle in a range of ±1° from the [1-10] direction is practically the most preferable.

The present inventor has studied the reason why the off-angle in the [1-10] direction reduces the in-plane anisotropy.

Figure 3:
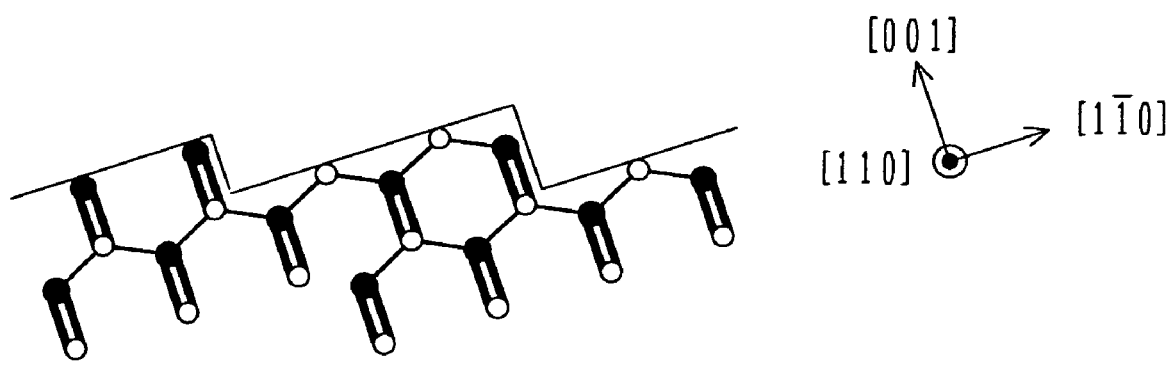
FIG. 3 is a schematic diagram showing a crystal structure in an inclined (001) substrate having a normal of a (001) plane inclined (set off) from a [001] direction to a [1-10] direction.

FIG. 3 is a schematic diagram showing a crystal structure of the (110) plane when the plane normal [001] of a (001) InP plane is inclined from the [001] direction to the [1-10] direction. By incorporating the off-angle, steps of crystallographic planes are generated on the surface at a constant distance interval in the [1-10] direction. For example, a step length in the [1-10] direction will be about 2.3 nm, assuming that a step height (one molecular layer thickness) is 0.2 nm and an off-angle is 5°.

The following assumption is made as at least one of the reasons why the size of each quantum dot on a (001) InP plane in the [1-10] direction is much larger than that in the [110] direction. A migration length of atoms, molecules and the like attached to a substrate surface is much longer than that in the [110] direction. Migration in the [1-10] direction may be hindered by generated steps. As the migration length in the [1-10] direction is shortened, the size of each quantum dot in the [1-10] direction may be reduced. One of the possibilities of forming anisotropy of migration lengths may be atomic layout on the (001) plane. In any case, there is a high possibility that steps generated by the off-angle contribute to reduction of anisotropy.

Figure 4:
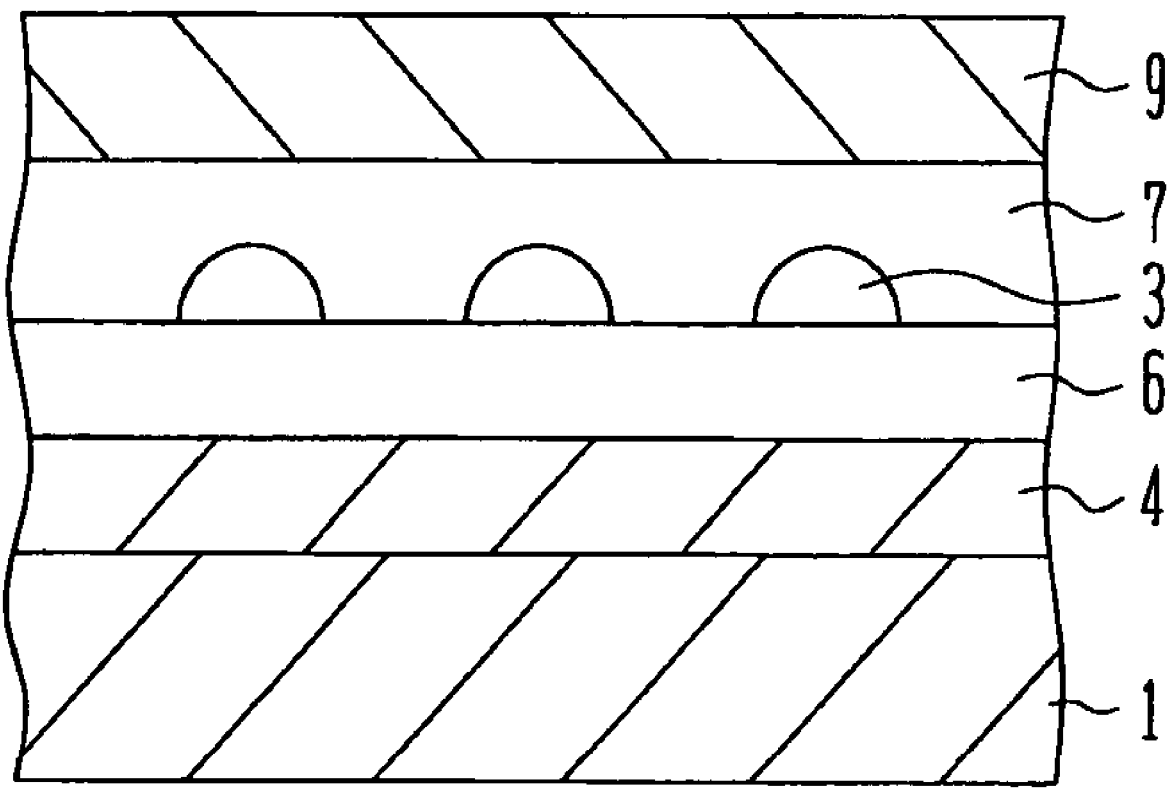
FIG. 4 is a cross sectional view of a semiconductor quantum dot device according to a first embodiment of the present invention.

FIG. 4 shows a quantum dot semiconductor device according to the first embodiment of the present invention.

An n-type inclined (001) InP substrate 1 having the normal [001] of the (001) InP plane being inclined by 5° to the [1-10] direction is loaded in a reaction chamber of a metal organic chemical vapor deposition (MOCVD) system, a phosphine atmosphere is formed by flowing phosphine ($PH_3$), and the substrate is heated to 600 to 650° C. After the temperature becomes stable, trimethylindium (TMIn) is additionally supplied, and Si (source material is, e.g., disilane ($Si_2H_6$)) is added as impurities to grow an n-type InP clad layer 4. The clad layer 4 has a thickness sufficient for providing a buffer layer function for adjusting crystallinity. On the n-type InP clad layer 4, an $Al_sIn_tGa_{1-s-t}As_uP_{1-u}$ barrier layer 6 is grown by using as source gases, trimethylaluminum (TMAl), TMIn, trimethylgallium (TMGa) $AsH_3$ and $PH_3$. For example, the $Al_sIn_tGa_{1-s-t}As_uP_{1-u}$ layer is grown at a growth rate of 1 μm/h and a V/III ratio of 200. The composition of the $Al_sIn_tGa_{1-s-t}As_uP_{1-u}$ layer is set, for example, to $Al_{0.15}In_{0.68}Ga_{0.17}As_{0.66}P_{0.34}$ which is the barrier layer corresponding to a wavelength of 1.1 μm.

After the barrier layer is grown, the substrate temperature is lowered to 450 to 500° C. in the $PH_3$ atmosphere. After the temperature becomes stable, a supply of $PH_3$ is stopped, and trimethylindium (TMIn), arsine ($AsH_3$) and trimethylantimony (TMSb) are supplied corresponding in amount to four molecular layers (MLs) converted to two-dimensional layer thickness to grow an InAsSb quantum dot layer 3. After the quantum dots are grown, an $Al_sIn_tGa_{1-s-t}As_uP_{1-u}$ layer 7 is grown to bury the quantum dot layer. If a growth temperature of the barrier layer 7 is the same as that of the quantum dots (namely the state that the temperature is lowered by 100° C. or more as compared to the barrier layer 6), the barrier layer 7 having good crystallinity can be grown by lowering the growth rate by 0.2 μm/h compared to that of the barrier layer 6. The quantum dot layer 3 is sandwiched between the barrier layers 6 and 7 and an active layer is formed. A p-type InP clad layer 9 is grown being doped with Zn (source material is, e.g., trimethizinc (TMZn)) as p-type impurities. In this manner, a diode structure is formed having the quantum dot layer contained in the active layer. The temperature is lowered to a room temperature in a hydrogen atmosphere and the substrate is taken out from the reaction chamber.

Figure 5:
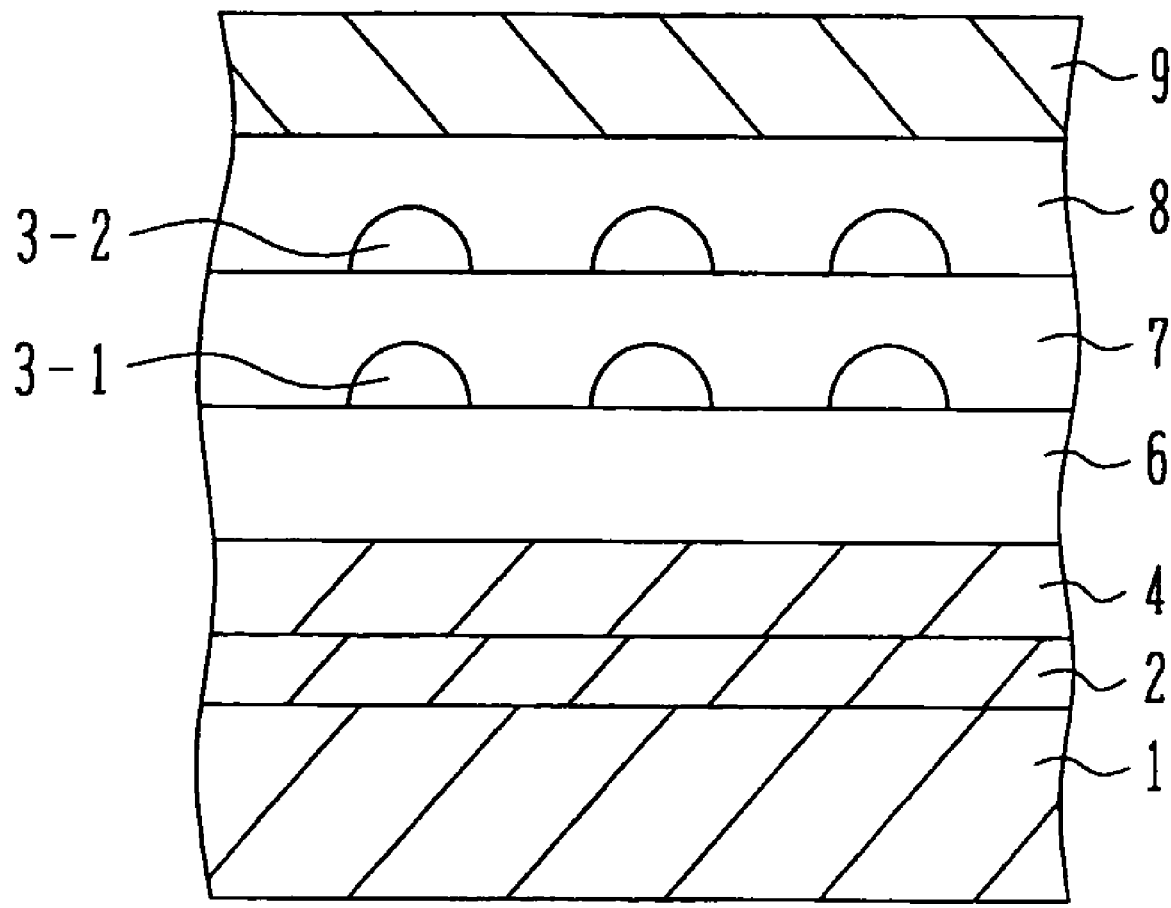
FIG. 5 is a cross sectional view of a semiconductor quantum dot device according to a second embodiment of the present invention.

FIG. 5 shows a quantum dot semiconductor device according to the second embodiment. An Si-doped n-type InP buffer layer 2 is grown on an n-type inclined (001) InP substrate 1 having the normal [001] of the (001) InP plane being inclined by 5° to the [1-10] direction, and thereafter an n-type InP clad layer 4 is grown. An $Al_sIn_tGa_{1-s-t}As_uP_{1-u}$ barrier layer 6 is grown on the n-type InP clad layer 4, and an InAsSb quantum dot layer 3-1 is grown on the barrier layer 6. An $Al_sIn_tGa_{1-s-t}As_uP_{1-u}$ barrier layer 7 is grown on the quantum dot layer 3-1, and an InAsSb quantum dot layer 3-2 is grown. An $Al_sIn_tGa_{1-s-t}As_uP_{1-u}$ barrier layer 8 is grown on the InAsSb quantum dot layer 3-2. An $Al_sIn_tGa_{1-s-t}As_uP_{1-u}$ barrier layer 8 is grown on the InAsSb quantum dot layer 3-2. In this manner, a plurality of quantum dot layers are formed in an active layer. The number of layers may be three or more layers. A thickness of each of the $Al_sIn_tGa_{1-s-t}As_uP_{1-u}$ barrier layers is, for example, 40 nm. A p-type InP clad layer 9 is grown on the uppermost barrier layer 8.

In the first and second embodiments, since an inclined InP substrate is used which has a plane normal inclined from [001] direction to the [1-10] direction, this plane orientation is inherited to an epitaxial layer to be grown on the substrate. InAsSb quantum dots formed above the substrate have relaxed in-plane anisotropy.

By selecting a composition of AlInGaAsP mixed crystal, desired values of a lattice constant and a band gap can be selected. Selecting a lattice constant provides a function of adjusting lattice mismatch and the size of each quantum dot. The barrier is grown in such a manner that a band gap is larger than that of quantum dots and a refractive index is smaller than that of quantum dots. The band gap influences an energy barrier of quantum dots. The compositions of upper and lower barrier layers may be changed. The composition of each mixed crystal is selected in accordance with an application field.

Figure 6:
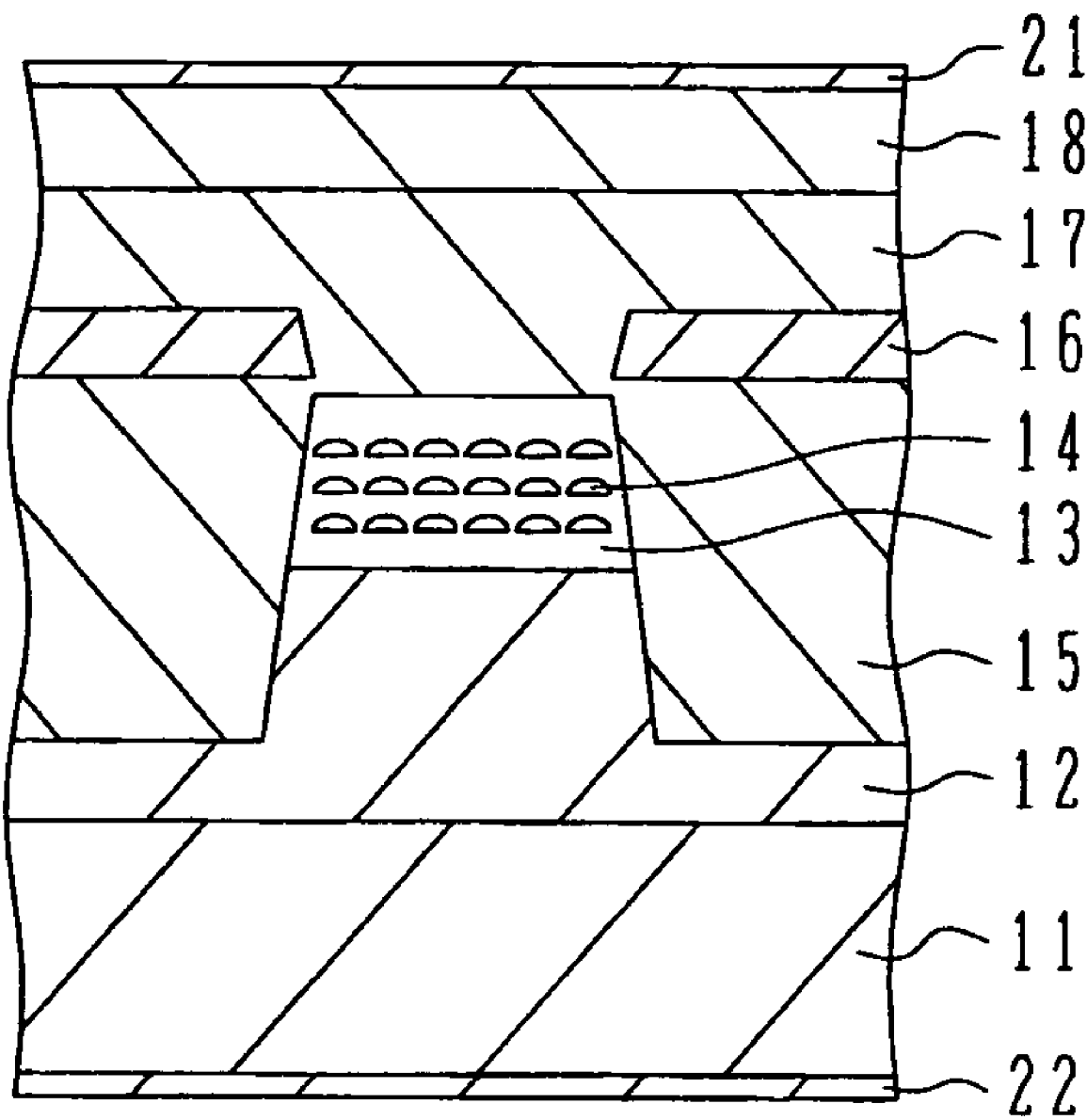
FIG. 6 is a cross sectional view of a mesa laser according to an embodiment of the present invention.

FIG. 6 shows the structure of a buried mesa type semiconductor layer using InAsSb quantum dots. The structure shown in FIG. 6 corresponds to a cross sectional view taken along a direction crossing a cavity direction.

An n-type InP clad layer 12 is epitaxially grown on an n-type inclined (100) InP substrate 11 to a thickness of 300 to 500 nm, with an n-type buffer layer being interposed therebetween if necessary. A concentration of n-type impurities, Si, is, for example, $5 \times 10^{17}$ $cm^{-3}$ (hereinafter, represented as 5E17, etc.). On the n-type InP clad layer 12, an InGaAsP barrier layer 13 and an InAsSb quantum dot layer 14 are alternately stacked. The barrier layer has a larger band gap and a smaller refractive index than those of the quantum dot layer and presents a carrier confinement and optical confinement function. In FIG. 6, although four barrier layers and three quantum dot layers are alternately stacked, the number of layers may be increased or decreased as desired. The uppermost barrier layer may be an optical confinement layer made of different material.

On the uppermost barrier layer 13, a part (partial thickness) of a p-type InP clad layer 17 is grown and thereafter a hard mask layer of silicon oxide or the like is formed in a stripe shape on the surface of the clad layer 17, and the active layer and upper and lower layers of the active layer are etched in a mesa shape. A p-type InP burying layer 15 and an n-type InP burying layer 16 are grown on the etched surface to bury the mesa structure.

The clad layer and burying layers have a wider band gap and a lower refractive index than those of the barrier layer, and present the optical confinement effect. The burying layers have also a current confinement effect. After the hard mask layer is removed, a remaining thickness of the p-type InP clad layer 17 is grown. For example, a total thickness of the p-type clad layer 17 is set to 2 to 3 µm and a concentration of p-type impurity Zn of the p-type clad layer 17 is set to 2E18. A p$^+$-type InGaAs contact layer 18 is grown on the p-type clad layer 17. For example, a concentration of p-type impurity Zn of the contact layer 18 is set to 1E19. A p-side electrode 21 is formed on the p-type contact layer 18, and an n-side electrode 22 is formed on the bottom of the n-type substrate 11. Optical output end planes are cleaved. An antireflection film is formed on both cleaved end planes of the cavity. A mesa laser structure is completed in this manner.

Figure 7:
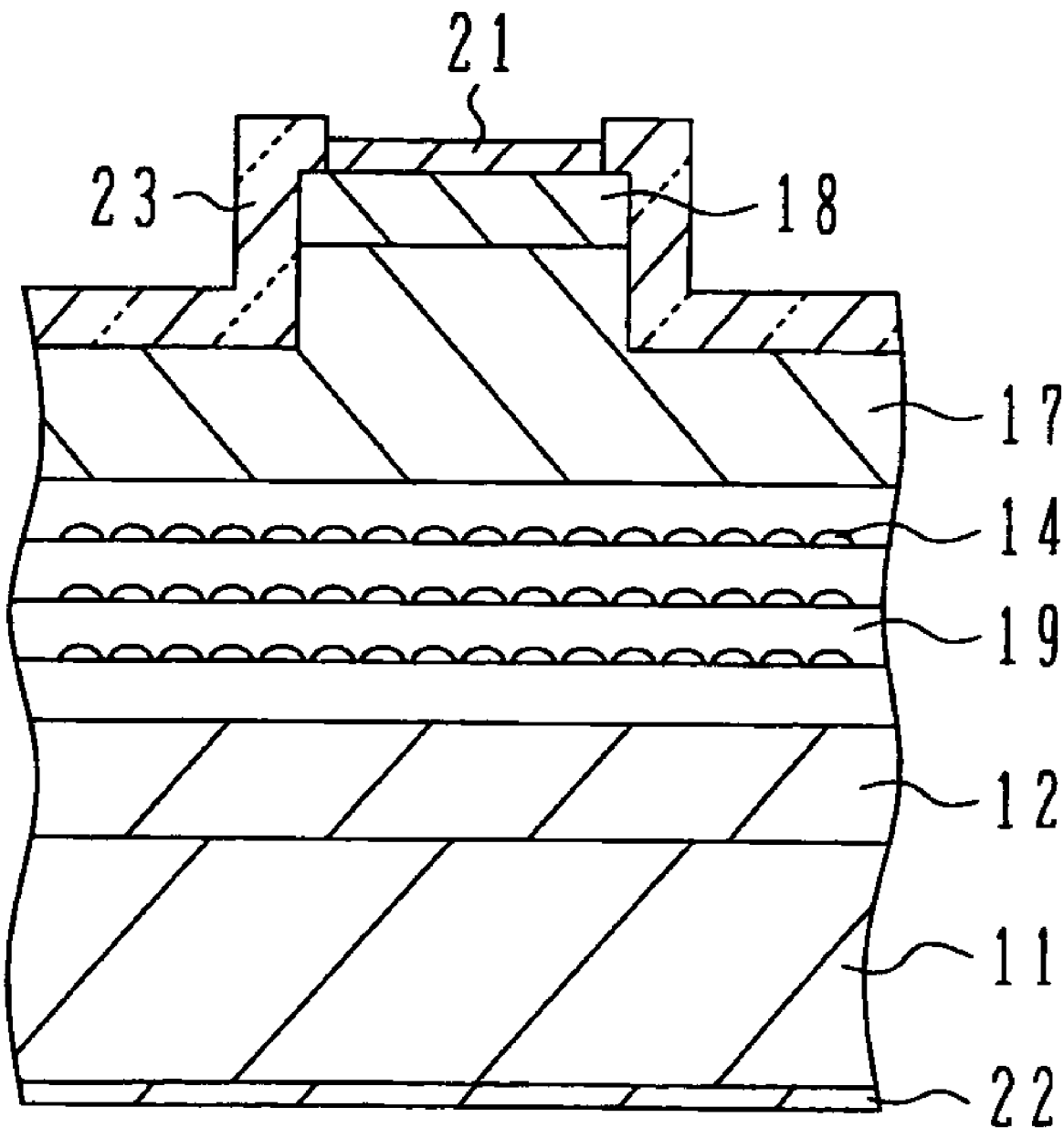
FIG. 7 is a cross sectional view of a ridge laser according to an embodiment of the present invention.

FIG. 7 shows a ridge type semiconductor laser using InAsSb quantum dot layers. Similar to the embodiment shown in FIG. 6, an n-type clad layer 12 is grown on an n-type inclined InP substrate 11, and InGaAsP barrier layers 19 and InAsSb quantum dot layers 14 are alternately stacked. On the uppermost barrier layer 19, a p-type clad layer 17 and an n-type contact layer 18 are grown. An etching mask in a stripe shape is formed on the p-type contact layer 18. The full thickness of the p-type contact layer 18 and a partial thickness of the p-type clad layer 17 are etched, outside the etching mask. After the mask is removed, an insulating film 23 is formed covering the ridge. An opening is formed through the insulating film 23 to expose the contact layer 18, and a p-side electrode 21 is formed on the exposed contact layer 18. An n-side electrode 22 is formed on the bottom of the n-type substrate.

The portions other than the inclined InP substrate and active layer (quantum dot layers, barrier layers) may be formed by well-known techniques. For example, reference may be made to the embodiments disclosed in JP-A-2002-184970 (U.S. Pat. No. 6,751,243) and JP-A-2004-288759 (U.S. patent application Ser. No. 10/708,219), which are incorporated herein by reference. Crystal growth is not limited only to MOVPE. For example, MBE may be used. Arsenic, As, source material may be tertialbuthylarsine (TBAs) or the like, in addition to AsH$_3$. Antimony, Sb, source material may be stibine (SbH$_3$) in addition to TMSb, and indium, In, source material may be triethylindidum (TEIn) in addition to TMIn.

The present invention has been described in connection with the preferred embodiments. The invention is not limited only to the above embodiments. For example, various well-known structures may be adopted as the semiconductor laser structure. In addition to the quantum dot laser, other semiconductor devices may be formed, including a semiconductor optical amplifier, an optical modulator, a wavelength converter switch and the like. It will be apparent to those skilled in the art that other various modifications, improvements, combinations, and the like can be made.

The present invention is applicable to semiconductor quantum dot devices using quantum dots, particularly to semiconductor quantum dot optical devices.

What I claim are:

1. A semiconductor quantum dot device comprising:
    an inclined InP substrate having a normal of a principal surface inclined from a [001] direction toward a [1-10] direction by an off-angle which is more than 5 degrees, and equal to or less than 10 degrees;
    a quantum dot layer containing semiconductor quantum dots made of InAs$_{1-x}$Sb$_x$ (0<x<1) and disposed above the principal surface of said inclined InP substrate; and
    a pair of barrier layers sandwiching said quantum dot layer, and formed of a group III-V compound including Al, In and Ga as a group III element, and As and P as a group V element.

2. The semiconductor quantum dot device according to claim 1, further comprising:
    a first conductivity type layer disposed below said pair of barrier layers; and
    a second conductivity type layer disposed above said pair of barrier layers.

3. The semiconductor quantum dot device according to claim 2, further comprising another quantum dot layer comprising InAs$_{1-x}$Sb$_x$ semiconductor quantum dots disposed on an upper one of said pair of barrier layers; and
    another barrier layer formed on said another quantum dot layer, and made of a group III-V compound including Al, In, and Ga as a group III element, and As, and P as a group V element.

4. The semiconductor quantum dot device according to claim 2, wherein said second conductivity type layer, said pair of barrier layers and upper portion of said first conductivity type layer are shaped n a mesa shape, and the semiconductor quantum dot device further comprises a burying region burying side surfaces of said mesa shape and having a carrier confinement function, the semiconductor quantum dot device functioning as a mesa laser.

5. The semiconductor quantum dot device according to claim 4, wherein the semiconductor quantum dot device is a semiconductor laser in a 1.55 µm wavelength band.

6. The semiconductor quantum dot device according to claim 2, wherein an upper region of said second conductivity type layer is shaped in a stripe shape, the semiconductor quantum dot device functioning as a ridge laser.

7. The semiconductor quantum dot device according to claim 6, wherein the semiconductor quantum dot device is a semiconductor laser in a 1.55 µm wavelength band.

8. The semiconductor quantum dot device according to claim 1, further comprising an InP buffer layer grown on said InP substrate.

9. A method of manufacturing a semiconductor quantum dot device comprising the steps of:
    (a) providing an InP substrate having a normal of a principal surface inclined from a [001] direction toward a [1-10] direction by an off-angle which is more than 5 degrees, and equal to or less than 10 degrees;
    (b) growing a first conductivity type layer above the InP substrate by MOCVD;
    (c) growing a lower barrier layer of a group III-V compound including Al, In, and Ga as a group III element, and As and P as a group V element above the first conductivity type layer by MOCVD;
    (d) growing semiconductor quantum dots made of InAs$_{1-x}$Sb$_x$ (0<x<1) on the lower barrier layer by MOCVD;
    (e) growing an upper barrier layer of a group III-V compound including Al, In and Ga as a group III element, and As and P as a group V element on the lower barrier layer burying the quantum dots, by MOCVD; and
    (f) growing a second conductivity type layer above the upper bonier layer by MOCVD, wherein said step (d) is done at a temperature lower than that of step (c).

* * * * *